United States Patent
Song et al.

(10) Patent No.: US 7,622,846 B2
(45) Date of Patent: Nov. 24, 2009

(54) BULK ACOUSTIC WAVE RESONATOR, FILTER AND DUPLEXER AND METHODS OF MAKING SAME

(75) Inventors: In-sang Song, Seoul (KR); Byeoung-ju Ha, Gyeonggi-do (KR); Duck-hwan Kim, Gyeonggi-do (KR); Yun-kwon Park, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 406 days.

(21) Appl. No.: 11/098,535

(22) Filed: Apr. 5, 2005

(65) Prior Publication Data

US 2005/0218755 A1 Oct. 6, 2005

(30) Foreign Application Priority Data

Apr. 6, 2004 (KR) .................. 10-2004-0023270

(51) Int. Cl.
 *H01L 41/09* (2006.01)
(52) U.S. Cl. ........................ 310/324; 310/348
(58) Field of Classification Search ............. 310/313 R, 310/313 B, 334, 322, 348, 324, 311, 363–366; 333/187, 189, 192; *H01L 41/08, 41/09*
See application file for complete search history.

(56) References Cited

U.S. PATENT DOCUMENTS

| | | | |
|---|---|---|---|
| 6,204,737 B1 | 3/2001 | Ellä | |
| 6,262,637 B1 | 7/2001 | Bradley et al. | |
| 6,349,454 B1 | 2/2002 | Manfra et al. | |
| 6,355,498 B1 | 3/2002 | Chan et al. | |
| 6,377,137 B1 | 4/2002 | Ruby | |
| 6,384,697 B1 | 5/2002 | Ruby | |
| 6,456,172 B1 | 9/2002 | Ishizaki et al. | |
| 6,486,751 B1 | 11/2002 | Barber et al. | |
| 6,496,085 B2 | 12/2002 | Ellä et al. | |
| 6,507,983 B1 | 1/2003 | Ruby et al. | |
| 6,550,664 B2 | 4/2003 | Bradley et al. | |

(Continued)

FOREIGN PATENT DOCUMENTS

EP 1 291 317 A2 3/2003

(Continued)

OTHER PUBLICATIONS

Korean Office Action dated Mar. 21, 2006.

(Continued)

*Primary Examiner*—Walter Benson
*Assistant Examiner*—Karen B Addison
(74) *Attorney, Agent, or Firm*—Staas & Halsey LLP

(57) ABSTRACT

A resonator having a membrane formed of a piezoelectric layer sandwiched between first and second electrode is suspended above a cavity formed from the back surface of the support structure. In one embodiment, the cavity walls are substantially perpendicular to the back surface. In another embodiment, the first electrode is formed in the cavity such that it is electrically connected to an electrode on the back surface of the support structure. In yet another embodiment, the cavity is formed via an etch through via holes in the back surface of the support structure, which leads to greater flexibility in designing a method of manufacture while reducing the need for alignment relative to other designs.

29 Claims, 5 Drawing Sheets

U.S. PATENT DOCUMENTS

| | | |
|---|---|---|
| 6,617,249 B2 | 9/2003 | Ruby et al. |
| 6,635,519 B2 | 10/2003 | Barber et al. |
| 6,713,314 B2 | 3/2004 | Wong et al. |
| 6,714,102 B2 | 3/2004 | Ruby et al. |
| 6,842,089 B2 * | 1/2005 | Lee .............................. 310/324 |
| 7,362,198 B2 * | 4/2008 | Larson et al. ................ 310/334 |
| 2002/0121337 A1 | 9/2002 | Whatmore et al. |
| 2003/0058065 A1 | 3/2003 | Abe et al. |
| 2003/0062807 A1 | 4/2003 | Takeuchi et al. |
| 2004/0027216 A1 | 2/2004 | Ma et al. |
| 2004/0185594 A1 | 9/2004 | Nishihara et al. |
| 2005/0248238 A1 | 11/2005 | Yamada et al. |

FOREIGN PATENT DOCUMENTS

| | | | |
|---|---|---|---|
| EP | 1291317 | * | 3/2003 |
| EP | 1 306 973 A2 | | 5/2003 |
| EP | 1306973 | * | 5/2003 |
| EP | 1 471 636 A1 | | 10/2004 |
| JP | 02-125475 | | 5/1990 |
| JP | 07-046072 | | 2/1995 |
| JP | 10-032454 A | | 2/1998 |
| JP | 10-32454 | * | 3/1998 |
| JP | 10-341131 A | | 12/1998 |
| JP | 2000-269773 A | | 9/2000 |
| JP | 2001-094373 | | 6/2001 |
| JP | 2001-332654 A | | 11/2001 |
| JP | 2003-204239 | | 7/2003 |
| JP | 2004-017171 | | 1/2004 |
| JP | 2004-503164 | | 1/2004 |
| WO | 02/05425 A1 | | 1/2002 |
| WO | WO 04/001964 | | 12/2003 |

OTHER PUBLICATIONS

European Search Report dated Jun. 22, 2006.
European Search Report dated Sep. 14, 2005.
Japanese Office Action dated Jan. 29, 2008.
Japanese Office Action dated Sep. 9, 2008 (with English Abstracts of JP 10-341131 and 10-032454).

* cited by examiner

BULK ACOUSTIC WAVE RESONATOR, FILTER AND DUPLEXER AND METHODS OF MAKING SAME

FIELD OF THE INVENTION

The present invention relates to a bulk mode piezoelectric vibrator, such as used in an electrical filter and/or duplexer, for instance, and to methods of making same.

BACKGROUND OF THE INVENTION

Acoustic resonators are used in many applications that require a precisely controlled frequency, including but not limited to wireless devices such as mobile telephones, pagers, radio receivers, microwave satellite communication devices, and various types of handheld electronics. In these devices, it is often important for components to take up as little space as possible on a monolithic integrated circuit, for instance, particularly if the resonator is part of a monolithic integrated circuit.

Acoustic resonators are useful in many applications such as electronic filters. Filters that use piezoelectric materials are particularly useful for frequencies above about 300 MHz where a thin film, non-conductive piezoelectric resonator is commonly used. Piezoelectric resonators can be fabricated into compact, high quality filters that can be integrated into radio frequency CMOS circuitry, for instance. Bulk acoustic wave (BAW) resonators and circuits such as filters formed using BAW resonators can be very compact, have a low insertion loss and high power handling.

BAW resonators in a basic form comprise a piezoelectric material sandwiched between two opposing electrodes, and preferably these elements, which form the resonator, are acoustically isolated from the substrate in order to have a high Q bulk wave filter. Such resonators could be manufactured using normal CMOS and/or bipolar silicon processing techniques to be optimally commercially feasible in monolithic integrated circuits manufactured using these processing techniques. Acoustically isolating the resonator structure can be a challenge, however.

FIG. 7 shows a prior art bulk resonator 710 formed over an etch stop layer 726 and an etchable layer 727, which are deposited on a silicon wafer 711, by first forming a first electrode 712, coating a piezoelectric layer 713 over both the first electrode 712 and the wafer surface, and forming a second electrode 714 on the opposite side of the piezoelectric layer 713 relative to the first electrode 712. A number of vias 715A are then etched in the front face of the piezoelectric layer 713 exposing the wafer surface under the piezoelectric layer 713 to a selective etching process that selectively etches the wafer 711 below the piezoelectric layer 713, creating a cavity 716. An uncoupled resonator membrane 715 composed of the first and second electrodes 712, 714 and the piezoelectric layer 713 is thus formed. It is emphasized that the resonator membrane 715 is decoupled from the wafer 711 by etching using front openings 715A in a resonator membrane 715. Further details of such resonators and the related manufacturing process can be found in U.S. Pat. No. 6,355,498 to Chan et al., herein incorporated by reference.

There are several apparent problems with this technique. First, the vias 715A must be carefully placed and dimensioned to avoid the first and second electrodes 712, 714, as well as the edges of the piezoelectric layer 713. Otherwise the vias 715A might adversely affect the performance of the resonator 710. If the vias 715A are not located, dimensioned and formed within tight tolerances, they may remove a portion of the piezoelectric layer 713 between the electrodes 712, 714, resulting in the frequency performance of the resonator being affected. Second, in certain embodiments, additional layers of etch stopping or delimiting materials 726 add to the cost and complexity of fabrication. Third, because adjacent circuit elements on the same wafer might be present in monolithic integrated circuits, there are limitations on the type, use and timing of the cavity etching material. Fourth, the etching process must be done before a protective cap can be applied.

In prior systems that etch the cavity from the back side of the substrate using KOH for instance (see, WO 02-05425, for example), device density is low due to the angle the cavity side walls for relative to the surface of the substrate. Using this approach, the formation of the cavity and the decoupling of the resonator membrane are purportedly achieved by etching the cavity from the backside (the side opposite to the resonator membrane) of the substrate and through the entirety of the substrate. This process, however, means that the device density is low. The KOH etch process results in side walls that form an angle of 54.7° with the back surface of a silicon substrate. Therefore, a resonator having a 150 µm×150 µm length and width will result in cavities having a 450 µm×450 µm length and width on the backside of a 530 µm wafer, as identified in U.S. Pat. No. 6,384,697. Additionally, this approach requires that the cavity be aligned on one side with a resonator structure on the other side, and two-sided alignment of structures can be a challenge.

SUMMARY OF THE INVENTION

These and other problems apparent in the prior art can be addressed by various embodiments of the present invention, as will be described below.

A resonator in accordance with a first embodiment of the invention includes a support structure, a first electrode located adjacent to a first surface of the support structure, a piezoelectric layer located adjacent to the first electrode and the first surface of the support structure, and a second electrode located adjacent to the piezoelectric layer on a side of the piezoelectric layer opposite to and in electrical isolation from the first electrode. The first electrode, the piezoelectric layer and the second electrode collectively constitute a resonator membrane structure. The support structure includes a cavity that extends from a second surface of the support structure, through the support structure and to a surface of the first electrode closest to the support structure such that at least part of said membrane structure is in acoustic isolation and over said cavity. In this embodiment, the cavity has walls that are substantially parallel to each other and perpendicular to the bottom or second surface of the support structure, i.e., the walls form an angle relative to the second surface of the support structure of 80° to 100°. In this way, device density can be maximized. In certain embodiments, the support structure may be thinner at locations of the substantially parallel-walled cavities. Also, a cap can be applied before the etching of the cavity, with a result of the membrane being less likely to be fouled by debris.

In a second embodiment, the cavity is formed under the resonator membrane structure using one or more vias extending from the cavity to the bottom or second surface of the support structure. This embodiment avoids the problems associated with placing vias through the front face of the piezoelectric layer and does not necessarily require rigorous side-sided alignment, particularly when etch delimiting layers are utilized. In this embodiment too, a cap can be applied before the etching of the cavity, with a result of the membrane being less likely to be fouled by debris.

In a third embodiment, a resonator includes a support structure in which a cavity extends from a first surface to a second surface of the support structure. A piezoelectric layer is located adjacent to the first surface of the support structure. A first electrode is located adjacent to the piezoelectric layer coextensive with the cavity and on at least a portion of a wall of the cavity in the support structure. A second electrode is located adjacent to the piezoelectric layer on a side of the piezoelectric layer opposite to and in electrical isolation from said first electrode. The first electrode, the piezoelectric layer and the second electrode form a resonant membrane structure. This embodiment facilitates electrical connections to the electrodes of the resonator membrane structure on the back surface of the support structure and allows the piezoelectric layer to be formed as a continuous layer without a step in the surface in the membrane, making the piezoelectric layer a better resonator.

BRIEF DESCRIPTION OF THE DRAWING FIGURES

The present invention shall be fully described by way of exemplary embodiments shown in the drawing figures to which the invention is not limited.

FIGS. 4A-4D are schematic diagrams showing an exemplary method of making the second embodiment.

DETAILED DESCRIPTION OF EXEMPLARY EMBODIMENTS

Figure 1:
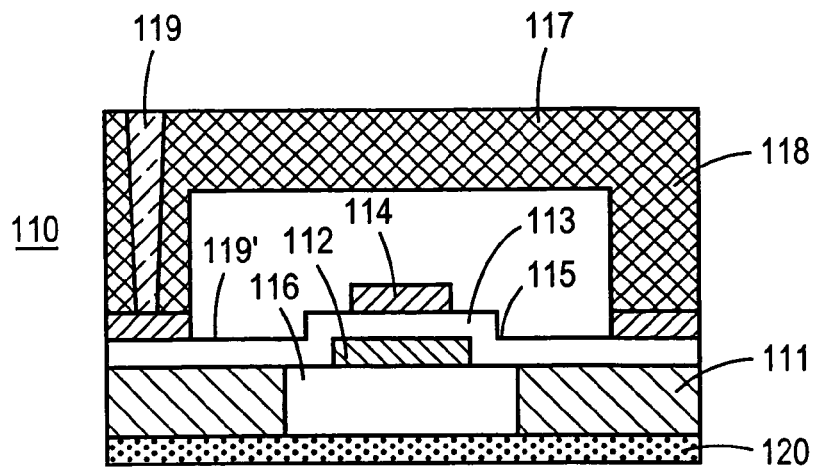
FIG. 1 is a schematic diagram of a first exemplary embodiment in accordance with aspects of the present invention.

The identification of certain advantages, optimal materials, processes and structures, and other characteristics of the exemplary embodiments in this written description should not be viewed as a disclaimer to embodiments that are within the scope of the claims but do not necessarily have the identified characteristics. Some embodiments will exhibit certain advantages, but not all necessarily exhibit any or all of the advantages. Like reference characters in the drawing identify similar but not necessarily identical parts, and the drawings are not drawn to scale, but instead are drawn to emphasize various parts for ease of understanding. Spatially relative terms such as "bottom", "top", "back", and "front", etc., are used only to make reference to the drawing figures, and are not intended to be reflective of any particular orientation of the actual devices.

First Embodiment

As shown in FIG. 1, an exemplary embodiment of the present invention is illustrated by a resonator 110, which includes a support structure 111. The support structure 111 can be made of any material that provides a rigid anchor to a resonator membrane 115 (described below) so at to not adversely interfere with membrane vibration. While it can be of nearly any material capable of physical support of the membrane 115 because the support structure 111 is not necessarily otherwise related to the performance of the resonator, it is commonly a Silicon (Si) or Gallium Arsenide (GaAs) wafer so as to permit the formation of other circuit elements on the same wafer to form an integrated monolithic device and/or to utilize conventional and even common semiconductor processing techniques for producing CMOS and bipolar devices, for instance. As a non-exclusive list, other materials include quartz, sapphire or magnesium oxide, and even somewhat flexible plastics, polymers and the like.

As shown in FIG. 1, a first electrode 112 is located adjacent to a first surface of the support structure 111. The first electrode 112 is formed of any suitable conductor, such as Al, Mo, Ti, W, Pt, Cu, Cr, Ag, Au, polysilicones and other materials, etc., or combinations thereof, for example. Mo is used in the present example because it can be formed using a low stress sputtering process and has suitable thermal characteristics. There can be other layers between the first electrode 112 and the support structure 111, such as oxide (e.g., $SiO_2$) or silicon nitride (SiN) layers for isolation and to act as etch stops, for example, as explained in more detail below.

A piezoelectric layer 113 is located adjacent to the first electrode 112 and the first surface of the support structure 111. The piezoelectric layer 113 can be AlN, ZnO, lead zirconate titantate (PZT), lead scandium tantalum oxide, bismuth sodium titanium oxide, CdS or combinations thereof, for example. Currently or in the future, there may be materials that are not listed and may not be commonly referred to as a piezoelectric material, but are nevertheless contemplated for inclusion herein. Any material acting like the listed piezoelectric materials in the context of the use contemplated herein is considered a piezoelectric material for purposes of the present disclosure.

A second electrode 114 is located adjacent to the piezoelectric layer 113 on a side of the piezoelectric layer 113 opposite to and in electrical isolation from the first electrode 112. The first electrode 112, the piezoelectric layer 113 and the second electrode 114, and any other non-illustrated layers that are in acoustic isolation from the support structure 111, are collectively referred to as a resonator membrane structure 115.

As can be seen, the support structure 111 includes a cavity 116 that extends from a second or bottom surface of the support structure 111, through the support structure 111 and to a surface of the first electrode 112 closest to the support structure 111 such that at least part of the membrane structure 115 is over the cavity 116. This permits the membrane structure 115 to vibrate freely at its resonate frequency. Unlike prior art structures that are formed using etching processes such as KOL that result in sidewalls having walls forming an angle of approximately 54.7° with the bottom or second surface of the support structure 111, in this illustrated embodiment the cavity has walls forming an angle relative to the second surface of the support structure 111 of approximately 80° to 100°, i.e., substantially parallel walls to one another. This can be achieved using a Reactive Ion Etch (RIE) process, for example, although any process that would result in a substantially parallel walled cavity 116 is contemplated.

For a RIE to be more practical when using conventional CMOS and bipolar fabrication process, the support structure 111 can be thinner or made thinner than might be otherwise expected, at least locally to the resonator 110. If embodied in a monolithic integrated circuit, the thinning may occur only at the resonator 110 or resonators if there are more than one, but the support structure 111 be of normal thickness elsewhere and be made of a semiconductor such as silicon. For instance, a typical thickness of a silicon substrate is anywhere from 480 µm to 530 µm. However, as explained below, the support structure 111 in a silicon substrate embodiment has a thickness of less than 100 µm, and more particularly a thickness of approximately 70 µm in the illustrated embodiment.

The first electrode 112 extends beyond the piezoelectric layer 113 on the first surface of the support structure 111 as shown in FIG. 1 to help support the membrane 115. Alternatively, the first electrode 112 can extend only part way across the membrane 115, and does not extend to the peripheral, supported parts of the piezoelectric layer 113. Lead lines or the like could or would be used in many embodiments to connect the first electrode 112 to an input/output connection.

In one embodiment, the resonator 110 includes a cap 117 covering at least the piezoelectric layer 113 and the second electrode 114. The cap 117 is a conventional structure that basically is formed by etching a hollow in a separate silicon substrate such that peripheral walls 118 are formed. See, WO 02-05425, for example. In the peripheral walls 118 ("peripheral" meaning peripheral to the resonator or protected structure, and not necessarily the cap 117, which might have many such hollows to be registered with matching resonator membrane structures 113) can be formed interconnect vias 119 filled with conductive material, such as gold. If gold via fill is chosen, then the Mo electrodes 112, 114 (or their leads) can be coupled to gold leads 119'. In this way, the gold leads 119' will form a better bond with the interconnect vias 119. Naturally, other combinations of materials and designs are possible.

A bottom plate 120 on the second surface of the support substrate 111 covers the cavity 116 to, among other functions, can serve to protect the resonator membrane structure 115 from becoming fouled with contaminants. This bottom plate 120 might be part of a board bearing other circuit elements in embodiments where the resonator 100, either as a stand-alone component on a Printed Circuit Board (PCB) or as a monolithic integrated circuit. The bottom plate 120 might be in the form of another substrate anodically bonded the support structure 115. Herein, a monolithic structure, on which other circuit components are formed, is called a board for differentiation in terminology, although it can be a wafer rather than a printed circuit board, for instance. Hence, non-limiting examples include a circuit board and a silicon wafer. This bottom plate 120 can be part of a housing, and the housing can but does not have to be part of a circuit-bearing board.

Next, an exemplary method of making the first embodiment will be described with reference to FIGS. 2A-2E.

Figure 2A:
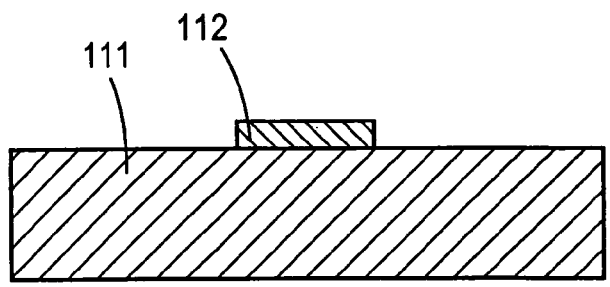
FIGS. 2A-2C are schematic diagrams showing an exemplary method of making the first exemplary embodiment.

As illustrated in FIG. 2A, an exemplary method of manufacturing the resonator shown in FIG. 1 includes the steps of patterning a first electrode 112 on a first surface of the support structure 111. The patterning step can include any method of depositing electrode material on the surface of the support structure 111 in a particular pattern. Conventional methods would include photolithography wherein a resist layer is first applied, exposed to a light source via a mask to selectively harden the resistant predetermined locations, removing the portions that were unexposed (or exposed, depending on whether the resist is a positive or negative resist) by a first etch, and either simultaneously or subsequently removing the conductive material underneath the removed portions of photoresist. Electrode lift-off processes could also be used. Thereafter, the residual hardened photoresist is removed, although none of these steps is essential or critical. All that is required is, whatever methodology is used, material is left in a pattern in a controlled fashion. Similarly, additional layers could be employed, such as a layer of SiN between the support structure 111 and the piezoelectric layer 113, for electrical isolation and/or present electro-migration, for instance.

Figure 2B:
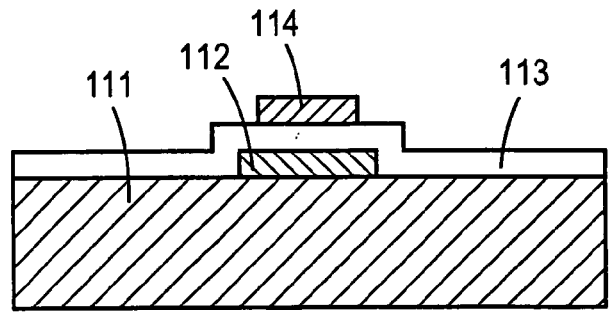

A piezoelectric layer 113 is then patterned on the support structure 111 to overlap with the first electrode 112, as shown in FIG. 2B. The piezoelectric layer 113 has a thickness that is selected to produce a design center frequency, and can be from 1 to 5 µm, with about 2.7 µm being a common thickness. A second electrode 114 is patterned on the piezoelectric layer 113. The first electrode 112, the piezoelectric 113 and the second electrode 114 form the resonator membrane structure 115.

Figure 2C:
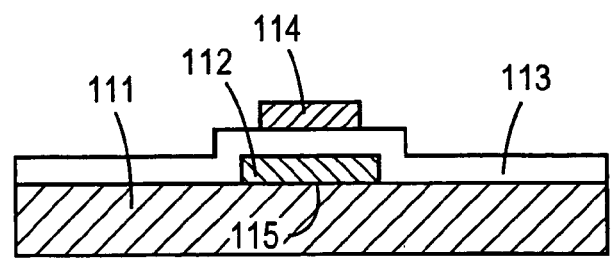

As shown in FIG. 2C, on a second surface of the support structure 111 opposite to the first surface on which the first electrode 112 is formed, a parallel walled via hole 116 acting as a cavity under the membrane 115 is formed. As mentioned elsewhere, a parallel-walled via hole 116 is distinct from prior art cavities, which involve removing substrate material using an etch material to remove substrate underneath the membrane 115. However, the walls in such a cavity in the prior art devices form an angle of approximately 54.7° relative to the second surface of the support structure 111. As a result, individual resonators need to be spaced apart by considerable distances, leading to relatively low device density using the prior art process.

Figure 2D:
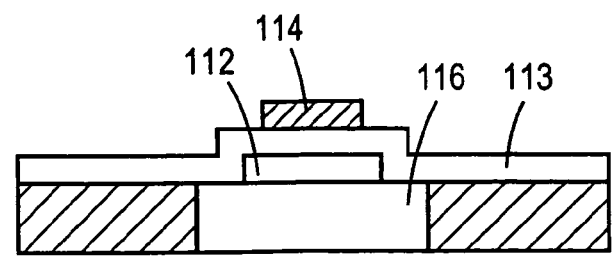

The present invention forms substantially parallel walled via holes 116 using a reactive ion etch (RIE) process, for example, as shown in FIG. 2D. Any method of forming parallel walled via holes 116 of suitable dimension would be acceptable. However, RIE when used on a silicone substrate having a conventional thickness can be optimized by thinning the support structure 111, as shown in FIG. 2C, at the location of the membrane 115 (or membranes in multiple device embodiments) before forming the parallel walled via hole 116. This thinning process can be carried out in any suitable manner including but not limited to KOL etching and tetra methyl-ammonium hydroxide (TMAH) etching, as non-limiting examples.

A cap 117 is formed to include a hollow space between its walls 18. The walls 18 can include deep RIE formed vias 119 for interconnects to the electrodes 112 and 114 to bond pads or solder balls on the outside of the resulting structure. The cap 119 can be bonded to the support structure 111, through anodic bonding, for example, optionally using borosilicate glass, for example, to result in the structure shown in FIG. 1. The bonding forms a seal and can be done in a vacuum, in a selected gas or in air. Embodiments that use a back-surface etch step (e.g., the three exemplary embodiments of the present disclosure, have a potential advantage in that the cap 117 can be bonded to the face of the resonator structure 310 before the cavity 116 is formed. In this way, the hermetically sealed resonator face surface is protected from the etching agents and the debris created by the etching and any other subsequent processes. This provides design freedom in the choice etching agents, which otherwise might have a detrimental effect on the electrodes 112, 114 for instance, and greater freedom in the timing of etching steps.

Second Embodiment

Figure 3:
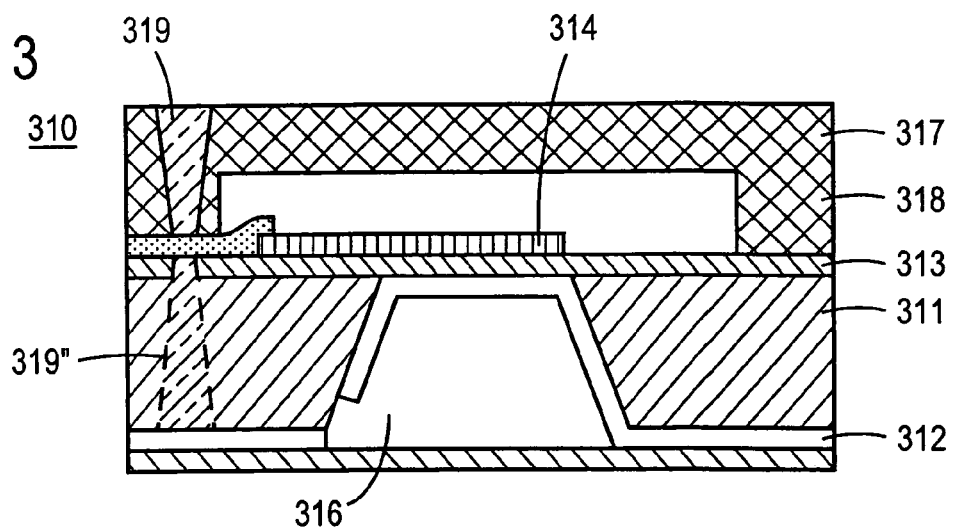
FIG. 3 is a schematic diagram of a second exemplary embodiment in accordance with aspects of the present invention.

Another embodiment of a resonator 310 is illustrated in FIG. 3, wherein the first electrode 312 extends from a surface of the piezoelectric layer 313 adjacent to the first surface of the support structure 311, across at least part of a wall of the cavity 316 and onto the second surface of the support structure 311. This embodiment facilitates back surface electrical connections and can be used to avoid step edges or discontinuities in the piezoelectric layer 313 of the membrane structure 315 that might otherwise cause a loss in lateral mode energy.

Figure 4A:
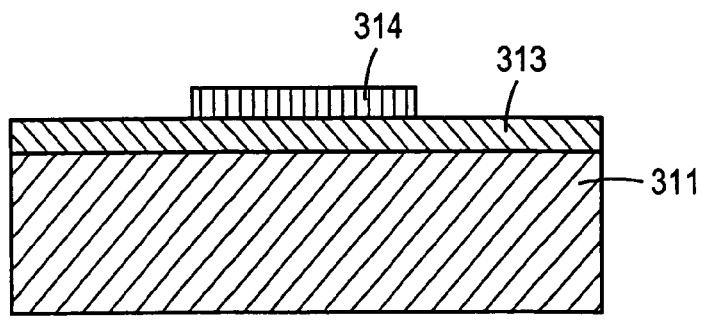

The method of manufacturing the second embodiment of the resonator as illustrated in FIG. 3 is similar to but not identical to the method used in the manufacturing of the embodiment shown in FIG. 1. Specifically, the manufacturing a resonator 310 in accordance with the embodiment shown in FIG. 4A includes the steps of patterning a piezoelectric layer 313 on a support structure 311 and patterning a second electrode 314 on the piezoelectric layer 313. It should be noted that the first electrode 312 has not yet been formed. A cap 317 can be bonded to cover the piezoelectric layer 313 and the second electrode 314, either now or later, as with the first embodiment described above.

Figure 4B:
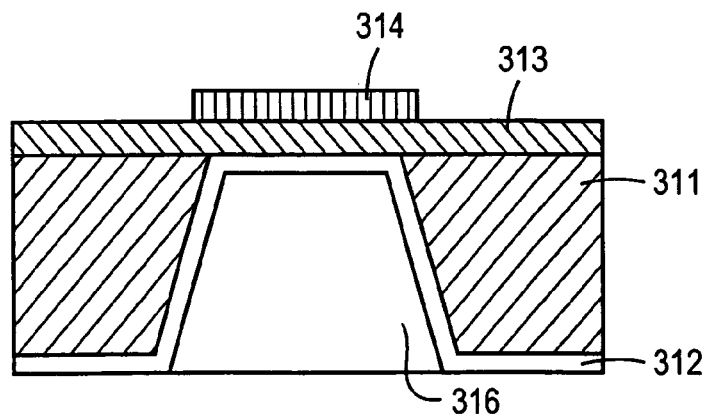

On a second surface of the support structure 311, opposite to the first surface, a cavity 316 is formed under the piezoelectric layer 313 as shown in FIG. 4B. Thereafter, a first electrode 312 is patterned in the cavity 316 to extend on the underside of the piezoelectric layer 313, across at least one wall or part of one wall of the cavity 316 and onto a second surface of the support structure 311. The first electrode 312 in the cavity 316, the piezoelectric layer 313 and the second electrode 314 collectively form a membrane structure 315.

The cavity 316 can be formed as a parallel walled via hole and, if so, the method may include, depending on the original thickness of the support structure 311 and the process for forming the cavity 316, the additional step of thinning the support structure 311 at at least a location of the membrane structure 315 before forming the parallel-walled via hole 316, to ease its formation using such techniques as reactive ion etching (RIE). Of course, other methods of manufacturing the cavity 316 can be employed including KOL etching, which would tend to lead to lower device density, but would nevertheless be acceptable in some applications.

Figure 4C:
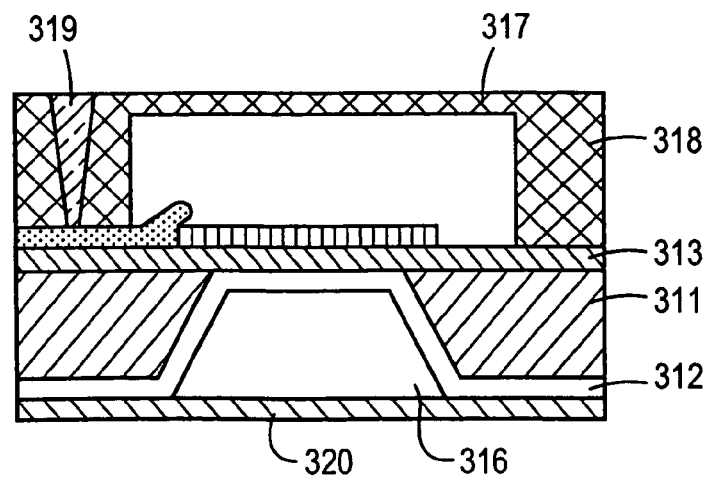

The method would include forming a cap 317 and affixing it onto the top surface of the support structure 311, where appropriate to protect the second electrode 314 and piezoelectric layer 313, in the same manner as in the first embodiment, for example. Additionally, the second surface of the support structure 311 can be fastened to a bottom plate 320 including establishing electrical connections via the bottom plate 320 to other circuit elements, in a manner similar to that disclosed in the first embodiment. Additionally, a second via 319 can be formed to interconnect the second electrode 314 through the cap 317, or, in the alternative, a second via 319" through support structure 311 to an electrode, electrode pad or solder ball on the second surface of the support structure 311, as shown in FIG. 4C and with dashed lines in FIG. 3.

Third Embodiment

Figure 5:
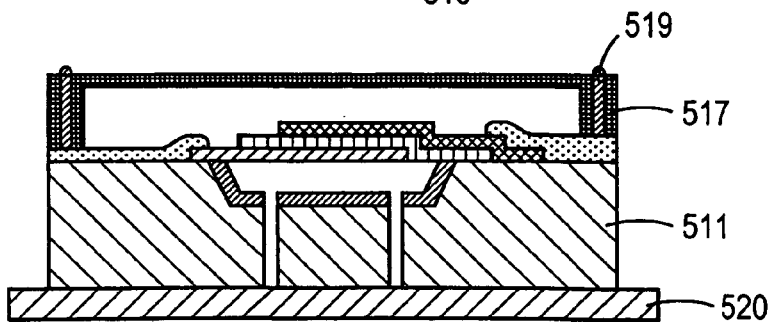
FIG. 5 is a schematic diagram of a third exemplary embodiment in accordance with aspects of the present invention.
Figure 7:
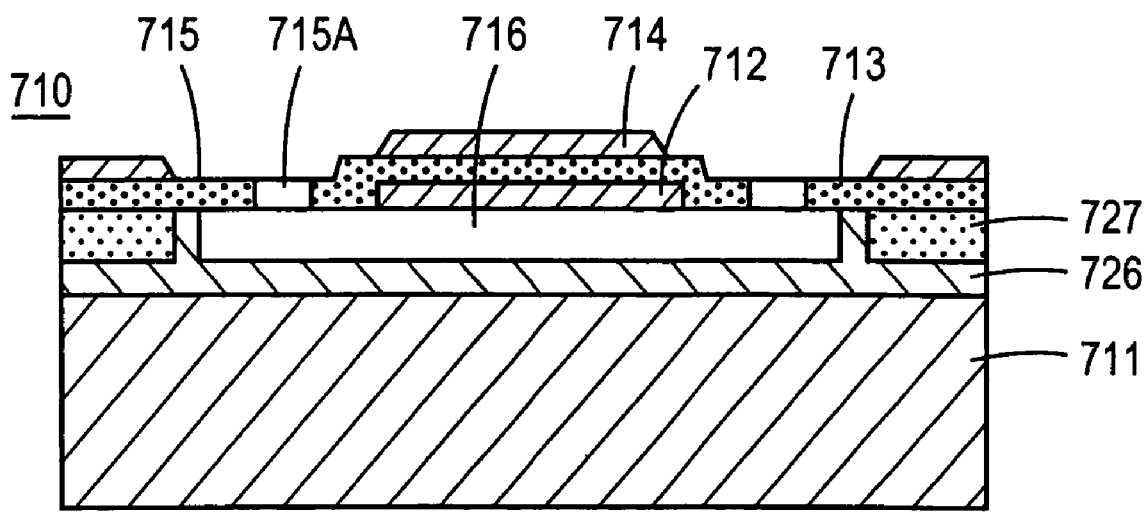
FIG. 7 is a schematic diagram of a prior art thin film resonator fabricated on a membrane created by front side releasing.

FIG. 5 shows a resonator 510 according to a third embodiment that includes a support structure 511 and a first electrode 512 located adjacent to a first surface of the support structure 511. A piezoelectric layer 513 is located adjacent to the first electrode 512 and the first surface of the support structure 511. A second electrode 514 is located adjacent to the piezoelectric layer 513 on a side of the piezoelectric layer 513 opposite to and in electrical isolation from the first electrode 512. The first electrode 512, the piezoelectric layer 513 and the second electrode 514 collectively form a resonant membrane structure 515.

The support structure 511 includes a cavity 516 that extends under the first electrode 512 such that at least part of the membrane structure 515 is over the cavity 516. The support structure 511 also includes the via hole 516A extending from the cavity 516 to a second surface of the support structure 511 opposite to the first surface of the support structure 511.

Where the support structure 511 is a silicon substrate, it could be of normal thickness or it could be thinned, e.g., having a thickness of less than 500 μm, and preferably of a thickness of less that 100 μm, and perhaps even better of 70 μm. A cap 517, with or without interconnect vias 519 can be added to cover the piezoelectric layer 513 and the second electrode 514 for the same reasons and relative timing as in the other embodiments. Additionally, a bottom plate 520 can be added on the second surface of the support structure 511, again, as with and for the same reasons as in the other embodiments. The bottom plate 520 would thereby cover the via(s) 516a. The bottom plate 520 might be a board bearing other circuit elements and/or plate is part of a board forming one side of a housing as explained in the description of the first and second embodiments.

A method of manufacturing the third exemplary embodiment of the present invention will now be described with reference to FIGS. 6A-6E. This exemplary method includes patterning a first electrode 512 on a first surface of a support structure 511, as shown in FIG. 6C. The fabrication method further includes patterning a piezoelectric layer 513 on the support structure 511 to overlap the first electrode 512 as shown inn FIG. 6D. Subsequently, a second electrode 514 is patterned on piezoelectric layer 513 as shown in FIG. 6E. The first electrode 512, the piezoelectric 513 and the second electrode 514 thus form a membrane 515.

Subsequent to forming the membrane 515, a parallel-walled via hole 516A is formed underneath the membrane 515 using RIE or other suitable method. This via 516A is smaller in dimension than yet-to-be formed cavity 516 and the membrane 515 and may not extend all the way to the membrane 515, although it can. The parallel-walled via hole 516A acts as a passageway for a dry or wet etch such that a portion of the support structure 511 is removed to form a cavity 516 under the membrane 515, by introducing an etching agent through the via hole 516A, as shown in FIG. 6F. Exposure to the etching agent can be limited to the backside of the support structure, either by bonding the cap 517 onto the front side of the support structure 511 before the etch step, of by selective sealing of the edges of the support structure 511 during the fabrication process, as with the other embodiments.

Figure 6A:
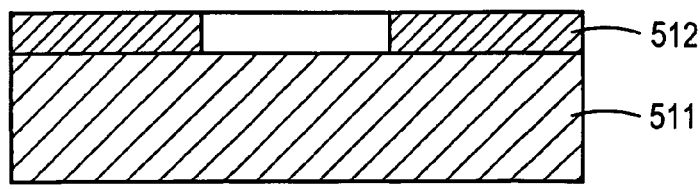
FIGS. 6A-6F are schematic diagrams showing an exemplary method of making the third embodiment.
Figure 6B:
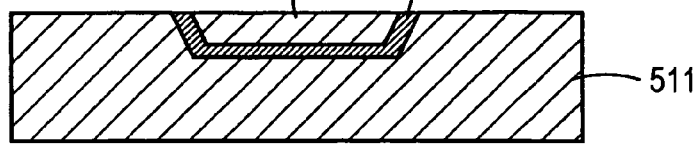
Figure 6C:
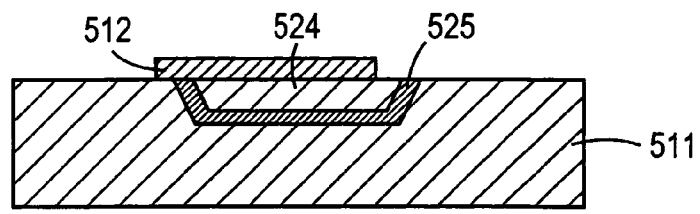
Figure 6D:
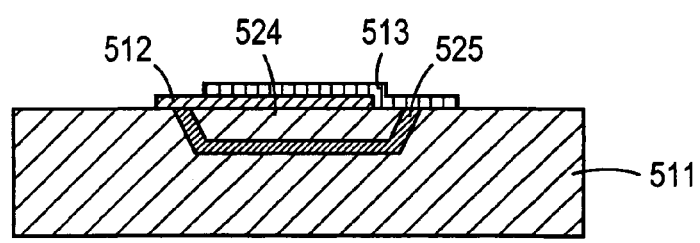
Figure 6E:
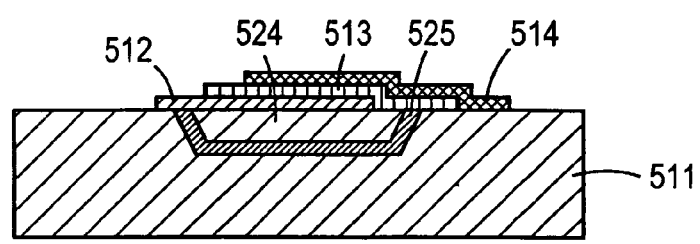
Figure 6F:
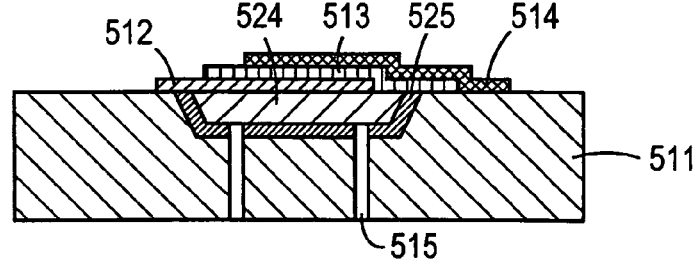

This method may include the further steps of forming a depression in the support structure 511 through a conventional lithography step for example, as shown in FIG. 6A, before forming the first electrode 512 and filling the depression with a sacrificial material 524 such as PGS, thermally grown silicon dioxide, polyvinyl, polypropylene, polystyrene or any other suitable material, to become part of the support structure 511. The sacrificial material is first deposited or epitaxially grown on the support structure 511, then polished to be level, and perhaps polished enough to expose the support structure 511, in any of several known manners, as shown in FIG. 6B. When the first electrode 512 is formed on the sacrificial material 524, the etching steps of forming the via and etching the sacrificial layer 524 removes the sacrificial material 524 to form the cavity underneath the membrane 515 by introducing an etching agent through the via hole 516A, as shown in FIG. 6F.

Figure 8:
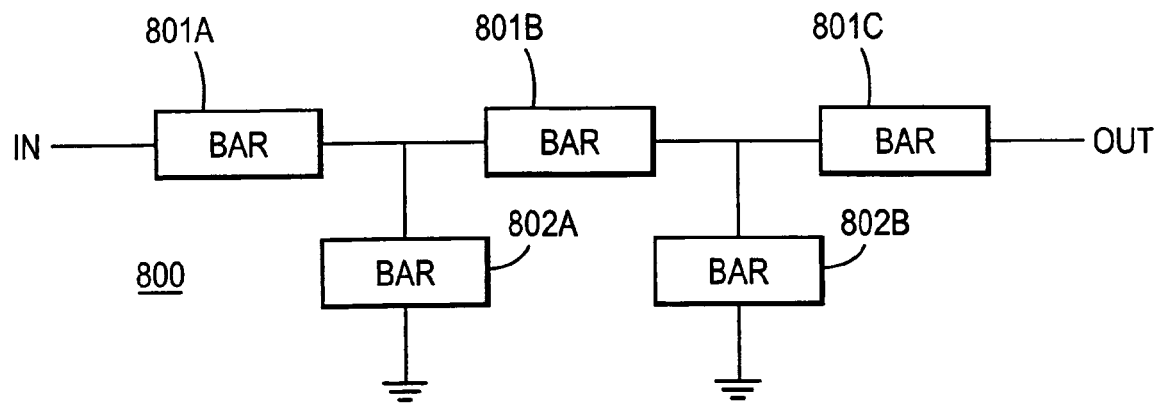
FIG. 8 is a circuit diagram of an exemplary filter circuit in which the novel resonators presented herein can be used.
Figure 9:
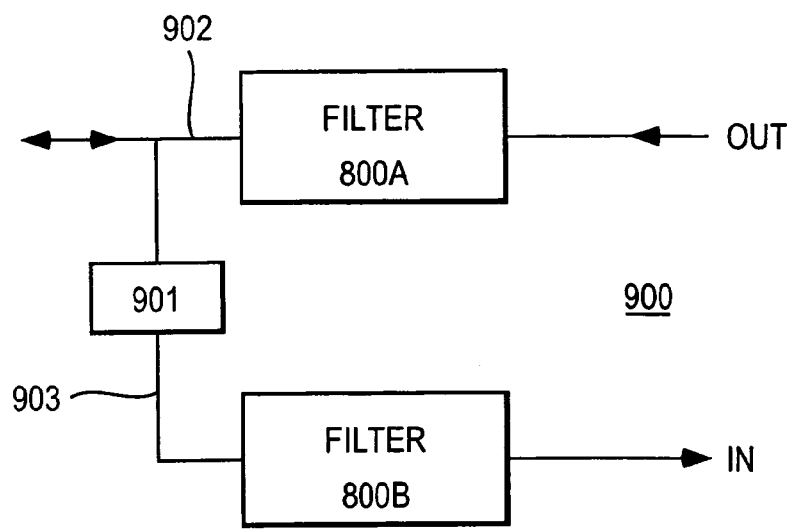
FIG. 9 is a circuit diagram of an exemplary duplexer in which the novel resonators presented herein can be used.

In addition to these steps, the method may also include forming at least in one etch stop layer 525 in the support structure 511 to demark the cavity 516. This can be, for instance done in accordance with U.S. Pat. No. 6,355,498, or simply as a low temperature oxide (LTO) layer formed in the depression prior to being filled with the sacrificial material. Generally, the placement of the vias 516A do not have to be as accurately placed on the back surface of the support structure 511 when etch stop layers 525 are employed because the etching can proceed until it is certain that the entire sacrificial layer 524 has been removed. s Filter and Duplexer Designs As illustrated in FIGS. 8 and 9, the above-described resonators 801*a*, 801*b*, 801*c*, 802*a*, 802*b* can be used in combination to act as a filter 800 or duplexer circuit 900. A filter circuit 800 may include a plurality of resonators 801*a*, 801*b*, 801*c*, 802*a*, 802*b*, connected in a ladder circuit such as shown in FIG. 8. The ladder circuit includes resonators 801*a*, 801*b*, 801*c* connected in the series, the intersections of which includes shunt lines carrying resonators 802*a*, 802*b* between the nodes of the series-connected resonators 801*a*, 801*b*, 801*c* and ground. The design center frequencies would be selected to provide the appropriate filter function, in a known manner. Such a filter circuit 800 can use both a single type of resonator structure shown in the exemplary first second and third embodiments as described above, or combinations thereof. For instance, the grounded resonators might use the second embodiment wherein the first electrode 311 is connected through the back surface to ground.

While one particular type of filter circuit is illustrated, it should be understood that the resonators described above may be used in a variety of configurations to result in different filters having different functions. The illustrated filter circuit is just one example of a multitude of filter configurations.

Likewise, such a filter circuit 800 can be combined with other filters connected together with, for instance, a phase change element 901 connected therebetween. In this way, the filter circuits 800A and 800B can form a duplexer 900 for use in two-way radio devices, for instance. As illustrated in FIG. 9, the duplexer 900 is a full duplexer having both a transmit channel 902 and a receive channel 903. There are many different types of duplexer and half duplexer designs. The exemplary circuit shown in FIG. 9 is but one example to which the invention is not limited.

Having explained the invention by way of exemplary embodiments, it is reiterated that the invention is not limited thereto. Modifications and variations will occur to those skilled in the art without departing from the scope of the present invention as defined in the claims appended hereto. For instance, multiple membranes can be stacked on top of one another (e.g., by the addition of a layer of piezoelectric layer and an additional electrode) to form a stacked bulk acoustic resonator (SBAR), and the methods and structures disclosed herein could be applied to surface acoustic resonators, for instance.

What is claimed is:

1. A resonator, comprising:
    a support structure;
    a first electrode located adjacent to a first surface of said support structure;
    a piezoelectric layer located adjacent to said first electrode and said first surface of said support structure; and
    a second electrode located adjacent to said piezoelectric layer on a side of said piezoelectric layer opposite to and in electrical isolation from said first electrode, said first electrode, said piezoelectric layer and said second electrode form a membrane structure,
    wherein said support structure includes a cavity that extends from a second surface of said support structure, through the support structure and to a surface of said first electrode closest to said support structure such that at least part of said membrane structure is over said cavity,
    wherein said cavity has walls, said walls forming an angle relative to said second surface of said support structure of 80° to 100°, and
    wherein said first electrode extends from a surface of said piezoelectric layer adjacent to said first surface of said support structure, across at least part of a wall of said cavity and onto said second surface of said support structure.

2. A resonator according to claim 1, wherein said support structure is a silicon substrate having a thickness of less than 100 µm.

3. A resonator according to claim 1, wherein said support structure is a silicon substrate having a thickness of approximately 70 µm.

4. A resonator according to claim 1, wherein said first electrode extends beyond said piezoelectric layer on said first surface of said support structure.

5. A resonator according to claim 1, further comprising:
    a cap covering said piezoelectric layer and said second electrode.

6. A resonator according to claim 1, further comprising a bottom plate on said second surface, wherein said bottom plate covers said cavity.

7. A filter comprising:
    a plurality of resonators connected in a ladder circuit including resonators connected in shunt and in series, wherein at least one of said resonators is in accordance with claim 1.

8. A duplexer comprising:
    a plurality of filters connected in together with a phase change element, wherein at least one of said filters is in accordance with claim 7.

9. A filter comprising:
    at least one resonator connected in a circuit including said at least one resonator and a shunt inductive element, wherein said at least one of resonator is in accordance with claim 1.

10. A duplexer comprising:
    a plurality of filters connected in together with a phase change element, wherein at least one of said filters is in accordance with claim 9.

11. A resonator, comprising:
    a support structure;
    a first electrode located adjacent to a first surface of said support structure;
    a piezoelectric layer located adjacent to said first electrode and said first surface of said support structure; and
    a second electrode located adjacent to said piezoelectric layer on a side of said piezoelectric layer opposite to and in electrical isolation from said first electrode, said first electrode, said piezoelectric layer and said second electrode form a membrane structure,
    wherein said support structure includes a cavity that extends from a second surface of said support structure, through the support structure and to a surface of said first electrode closest to said support structure such that at least part of said membrane structure is over said cavity,
    wherein said cavity has walls, said walls forming an angle relative to said second surface of said support structure of 80° to 100°, and
    wherein said bottom plate is part of a board bearing other circuits elements.

12. A resonator, comprising:
    a support structure;

a first electrode located adjacent to a first surface of said support structure;

a piezoelectric layer located adjacent to said first electrode and said first surface of said support structure; and a second electrode located adjacent to said piezoelectric layer on a side of said piezoelectric layer opposite to and in electrical isolation from said first electrode, said first electrode, said piezoelectric layer and said second electrode form a membrane structure, wherein said support structure includes a cavity that extends from a second surface of said support structure, through the support structure and to a surface of said first electrode closest to said support structure such that at least part of said membrane structure is over said cavity, wherein said cavity has walls, said walls forming an angle relative to said second surface of said support structure of 80° to 100°, and wherein said bottom plate is part of a board forming one side of a housing.

13. A resonator, comprising:

a support structure;

a first electrode located adjacent to a first surface of said support structure;

a piezoelectric layer located adjacent to said first electrode and said first surface of said support structure;

a second electrode located adjacent to said piezoelectric layer on a side of said piezoelectric layer opposite to and in electrical isolation from said first electrode, wherein said first electrode, said piezoelectric layer and said second electrode form a membrane structure, wherein said support structure includes a cavity that extends under said first electrode such that at least part of said membrane structure is over said cavity, and wherein said support structure also includes said at least one via hole extending from said cavity to a second surface of said support structure opposite to said first surface of said support structure; and a bottom plate on said second surface of said support structure, wherein said bottom plate covers said at least one via hole, wherein said bottom plate includes an electrical connection to said first electrode.

14. A resonator according to claim 13, wherein said support structure is a silicon substrate having a thickness of less than 500 μm.

15. A resonator according to claim 13, further comprising:

a cap covering said piezoelectric layer and said second electrode.

16. A resonator according to claim 13, wherein said bottom plate is part of a board bearing other circuit elements.

17. A resonator according to claim 13, wherein said bottom plate is part of a board forming one side of a housing.

18. A filter comprising:

a plurality of resonators connected in a ladder circuit including resonators connected in shunt and in series, wherein at least one of said resonators is in accordance with claim 13.

19. A duplexer comprising:

a plurality of filters connected in together with a phase change element, wherein at least one of said filters is in accordance with claim 18.

20. A filter comprising:

at least one resonator connected in a circuit including said at least one resonator and a shunt inductive element, wherein said at least one of resonator is in accordance with claim 13.

21. A duplexer comprising:

a plurality of filters connected in together with a phase change element, wherein at least one of said filters is in accordance with claim 20.

22. A resonator, comprising:

a support structure in which a cavity is formed extending from a first surface to a second surface of the support structure;

a piezoelectric layer located adjacent to said first surface of said support structure;

a first electrode located adjacent to said piezoelectric layer coextensive with said cavity and on at least a portion of a wall of said cavity in said support structure; and a second electrode located adjacent to said piezoelectric layer on a side of said piezoelectric layer opposite to and in electrical isolation from said first electrode, wherein said first electrode, said piezoelectric layer and said second electrode form a membrane structure.

23. A resonator according to claim 22, further comprising a bottom plate on said second surface of said support structure, wherein said bottom plate includes an electrical connection to said first electrode.

24. A resonator according to claim 23, wherein said bottom plate is part of a board bearing other circuit elements.

25. A resonator according to claim 23, wherein said bottom plate is part of a board forming one side of a housing.

26. A filter comprising:

a plurality of resonators connected in a ladder circuit including resonators connected in shunt and in series, wherein at least one of said resonators is in accordance with claim 22.

27. A duplexer comprising:

a plurality of filters connected in together with a phase change element, wherein at least one of said filters is in accordance with claim 26.

28. A filter comprising:

at least one resonator connected in a circuit including said at least one resonator and a shunt inductive element, wherein said at least one of resonator is in accordance with claim 22.

29. A duplexer comprising:

a plurality of filters connected in together with a phase change element, wherein at least one of said filters is in accordance with claim 28.

* * * * *

UNITED STATES PATENT AND TRADEMARK OFFICE
CERTIFICATE OF CORRECTION

PATENT NO. : 7,622,846 B2 Page 1 of 1
APPLICATION NO. : 11/098535
DATED : November 24, 2009
INVENTOR(S) : Insang Song et al.

It is certified that error appears in the above-identified patent and that said Letters Patent is hereby corrected as shown below:

Column 10, Line 64, change "circuits" to --circuit--.

Signed and Sealed this

Ninth Day of February, 2010

David J. Kappos
*Director of the United States Patent and Trademark Office*